April 22, 1969 W. B. MITCHELL 3,440,498

CONTACTS FOR INSULATION ISOLATED SEMICONDUCTOR INTEGRATED CIRCUITRY

Filed March 14, 1966

INVENTOR:
WALTER B. MITCHELL
BY
Curtis, Morris & Safford
ATTORNEYS.

United States Patent Office 3,440,498
Patented Apr. 22, 1969

3,440,498
CONTACTS FOR INSULATION ISOLATED SEMICONDUCTOR INTEGRATED CIRCUITRY
Walter B. Mitchell, Danbury, Conn., assignor to National Semiconductor Corporation, Danbury, Conn.
Filed Mar. 14, 1966, Ser. No. 534,007
Int. Cl. H01j 5/06, 19/00
U.S. Cl. 317—234 5 Claims

ABSTRACT OF THE DISCLOSURE

A monolithic semiconductor apparatus including a plurality of transistor-like devices, the emitters of which are all commonly connected by means of a conductive substrate, upon which the transistor-like devices are formed. In a preferred embodiment of the invention the conductive substrate includes a plurality of cup-shaped recesses lined with an insulative coating for insulating all but one region of each transistor-like device from the conductive substrate, thus providing a built-in interconnection between the transistor-like elements.

The present invention relates to semiconductor devices and circuits and methods of manufacturing the same; more particularly, the present invention relates to transistors and integrated circuits, and to methods of manufacturing such transistors and circuits.

The use of modern diffusion manufacturing techniques has greatly improved the manufacture of semiconductor devices. In the usual diffusion process, impurities are diffused into the upper planar surface of a flat semiconductor wafer in various patterns. Such a technique, however, has a serious deficiency in that it usually makes it necessary for the emitter electrode of the device to be located on the upper surface of the wafer.

In many devices, and especially in integrated circuits, it would be desirable to locate the emitter on the bottom of the wafer rather than on its top surface. One reason for this is that the transistors often are connected together in a common grounded-emitter circuit; that is, in a circuit in which the emitter electrodes of the transistors are connected together and to ground. If the emitter electrode is on the top surface of each transistor, a considerable number of lead wires are required merely to connect the emitters of the transistors together and to connect this common connection to ground. In a "monolithic" integrated circuit, that is, a circuit with all of the circuit elements fabricated in a single semiconductor wafer, the leads are formed by depositing metal film on the upper surface of the wafer. Having the emitters of the transistors on top increases the area of metallization on the upper surface. In either the integrated circuit or the circuit using discrete devices, location of the emitters on top of the transistors increases the capacitance of the circuit, especially in circuits for operation at very high frequencies. If it were possible to readily provide a transistor whose collector electrode is on the upper surface, not only would circuit performance be improved but the connection of the common emitters to ground would be facilitated.

Although various semiconductor constructions have been proposed for providing a device with a downwardly-facing emitter electrode, such constructions generally have been far from satisfactory in that they are costly, complex, and generally give unsatisfactory performance.

Accordingly, it is a major object of the present invention to provide a simple structure and method for producing a semiconductor device with a downwardly-facing electrode usable as an emitter electrode. Another object of the present invention is to provide a semiconductor device in which each of the electrodes at the top and bottom of a semiconductor wafer can be used either as a collector or an emitter electrode, as desired. Another object of the present invention is to provide a novel integrated circuit structure requiring a minimum of metallic conductors for making interconnections. A further object of the present invention is to provide a semiconductor device and circuit ideally suited for logic functions. A still further object of the present invention is to provide a semiconductor circuit with multiple output electrodes conductively isolated from its input electrodes and having an internal common ground connection. Other objects of the invention will be either set forth in or apparent from the following description and drawings in which:

Figure 8:
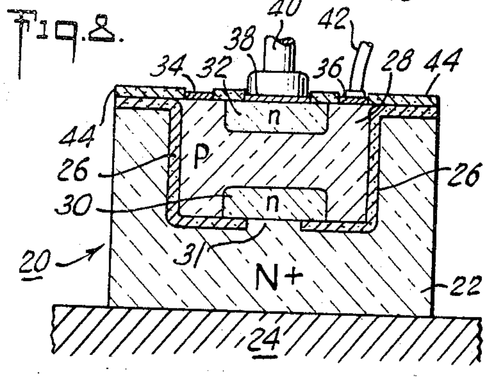

FIGURE 8 shows a semiconductor device 20 constructed in accordance with the present invention. The device 20 includes an epitaxial lower portion 22 of n+ type semiconductor material, preferably silicon, bonded to a metal "header" or mounting plate 24. A body 28 of p-type silicon is located within a cup-shaped recess in the layer 22, with a cup-shaped layer 26 of insulating material, preferably silicon oxide, providing insulation between body 28 and the layer 22. The silicon body 28 has a region 30 of n-type conductivity located centrally in its lowermost portion. Region 30 makes contact with the material of epitaxial layer 22 through a hole 31 in the bottom of the cup-shaped silicon oxide layer 26. A zone 32 of n-type conductivity is located in the upper surface of body 28. Metallic ohmic contacts 34 and 36, preferably of aluminum, are formed on the surface portion of the body 28. A similar ohmic contact 38 is formed on the surface of zone 32. The upper edge of the junction between zone 32 and body 28 and the remainder of the upper surface of the device 20 are covered by a protective silicon oxide insulating coating 44. A relatively heavy collector lead wire 40 is thermo-compression bonded to the metal contact 38, and a similar wire 42 is similarly bonded to the metal contact 36.

The epitaxial layer 22 is made highly conductive by doping it with appropriate impurities so as to provide a conductive support structure for the remainder of the device. Layer 22 might be replaced by a highly conductive and structurally stable material such as a metal, for example.

Advantageously, the n-type zone 32 and the n-type region 30 are almost identical in size, shape and resistivity. This means that the interelectrode capacitances and breakdown voltages of the junctions will be substantially the same. Either the zone 32 or the region 30 can be used as the emitter electrode of the device 20, while the other lead is used as the collector and the body 28 serves as the base electrode.

Since either zone 32 or region 30 can be used as the emitter electrode of the device 20, the device 20 has the highly desirable feature of providing a downwardly-facing emitter electrode. Thus, an electrical ground connection can be made to the device 20 merely by grounding the metal header 24 when it is desired to use the device as a grounded-emitter transistor. The location of the collector electrode at the uppermost wafer surface facilitates circuit interconnections. Moreover, the relatively small size of the body 28, the zone 32 and region 30 minimizes the internal capacitance of the device 20.

It should be noted that it is not necessary that the insulating layer 26 and the body 28 have the shape shown in FIGURE 8. For example, insulating layer 26 need not be cup-shaped or inverted hump-shaped as shown, but may instead be flat or have other shapes, as will be described in greater detail below.

FIGURES 1 through 7 illustrate a unique and highly advantageous method of manufacturing the device shown in FIGURE 8, and also show another embodiment of a semiconductor device constructed in accordance with the present invention.

Figure 1:
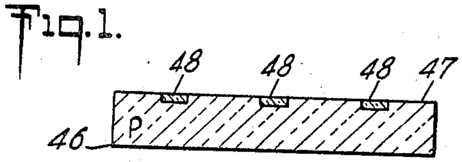
FIGURES 1 through 8 show a semiconductor device of the present invention at various stages of manufacture in accordance with the present invention.

Referring first to FIGURE 1, a thin "slice" or "wafer" 46 of p-type semiconductor material, preferably silicon, is used as a starting material. In the upper surface 47 of the wafer 46 are formed a plurality of regions 48 of n-type conductivity. These regions are formed by conventional photo-masking, etching and diffusion techniques such as those described and shown in the copending U.S. patent application Ser. No. 531,104, filed Mar. 2, 1966 of Arthur V. Siefert, David A. McLaughlin, Milton Schneider, Richard R. Rau and Joseph J. Gruber, entitled "Semiconductor Device And Manufacturing Method," which application hereby is incorporated in this description. Although only three regions 48 are shown in FIGURE 1, it should be understood that the typical semiconductor wafer usually will have a far greater number of regions 48, one for each individual transitsor or other device being formed.

The above-described diffusion step typically leaves an oxide coating on the upper surface of the wafer 46. As is shown in FIGURE 1, the resultant oxide coating has been removed to facilitate performance of the mesa-formation step to be described in connection with FIGURE 2. However, if it is not desired to perform the mesa formation step to be described below, this oxide coating need not be removed.

Figure 2:
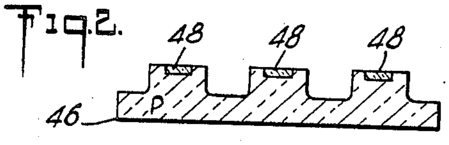

Referring now to FIGURE 2, the material around each region 48 is etched away so as to give the semiconductor material a "mesa" configuration around each region 48. Hence, at this stage, the wafer 46 consists of a semiconductor body with a plurality of flat-topped projections each having a n-type region 48 at its top. Known techniques can be used to form the mesa projections. Typically, the mesa-forming process includes formation of an oxide coating on the surface 47, photo-masking and etching the oxide to expose portions of the semiconductor to be etched away, and then etching those portions to remove the undesired materials and form the mesa projections. Such a mesa formation technique is described in greater detail in the above-identified copending U.S. patent application.

Figure 3:
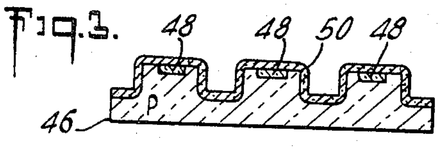

As is shown in FIGURE 3, after the mesa formation step is completed, an insulating coating 50 is applied to the upper surface of the wafer 46. Preferably, the insulating coating 50 is a silicon oxide coating which can be formed by a number of well known techniques, including thermal growth, pyrolitic techniques, etc.

Figure 4:
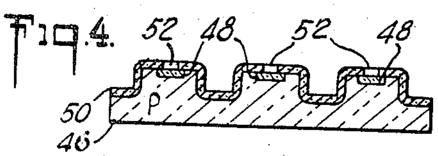
Figure 5:
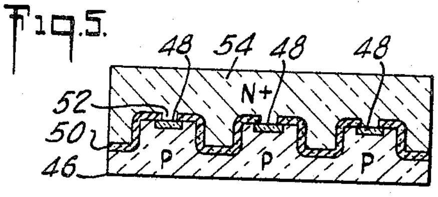

Referring now to FIGURE 4, a hole 52 is formed in the oxide coating 50 above each region 48. The holes 52 can be formed by photo-masking and etching. Then, as is shown in FIGURE 5, an epitaxial layer 54 of n+ type silicon is grown on top of the insulating layer 50 by known techniques. The epitaxial material of layer 54 contains a relatively high concentration of n-type impurities and thus is highly conductive. Epitaxial layer 54 forms a low-resistivity conductive path to each of the regions 48 in the wafer 46. Thus, the epitaxial layer 54 forms a low-resistivity common connection between all of the plurality of regions 48 in the wafer 46. Since, as will be apparent from the description to be given below, the layer 54 merely provides structural support and a low-resistance connection to the regions 48, alternatively it might be formed of any suitable high-conductivity material such as a metal.

Figure 6:
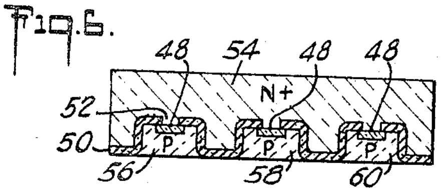

Referring now to FIGURE 6, the bottom surface of the structure shown in FIGURE 5 is removed up to or past the lowermost surfaces of insulating layer 50, thus dividing the wafer 46 into three separate bodies 56, 58 and 60, each electrically insulated from the other by the insulating layer 50. The bottom portion of wafer 46 can be removed by well-known techniques such as etching. However, it is preferred to perform this step by mechanical lapping and polishing, which may be followed by a shallow chemical etching step to clean the mechanically lapped surface. Although the amount of material removed in this lapping step need not be limited to that shown in FIGURE 6, it is preferred to remove only enough material to separate the wafer into isolated zones 56, 58 and 60 and leave the insulating coating 50 intact.

Figure 7:
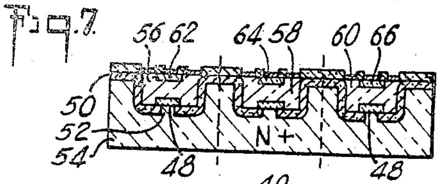

After the lapping step is complete, the wafer is turned over as is shown in FIGURE 7, and a zone 62, 64 or 66 of n-type conductivity is formed in the upper surface of each body 56, 58 or 60, respectively. The zones 62, 64 and 66 are formed by conventional diffusion techniques similar to those used in forming the n-type regions 48. Each n-type zone preferably is identical in depth, lateral extent and concentration of impurities so as to form a symmetrical n-p-n transistor in each body 56, 58 or 60.

Aluminum or other conducting materials is vapor-deposited onto the upper surface of the wafer and is selectively etched away to leave metal in contact with each of the bodies 56, 58 and 60 to form base contacts, and also contacting each of the zones 62, 64 or 66 to provide emitter or collector contacts. The aluminum contacts are heated in a well-known temperature cycle to alloy the aluminum with the silicon without forming a rectifying barrier.

If it is desired to make single transistors such as the one shown in FIGURE 8, it is necessary merely to cut the wafer by conventional techniques to separate each of the bodies 56, 58 and 60 from one another to form three separate devices. Then, electrode leads such as leads 40 and 42 shown in FIGURE 8 can be added as described above, the device may be mounted on a metallic header 24, or may be mounted in other conventional structures to be used as a single transistor.

It is possible to use the structure shown in FIGURE 7 as an integrated circuit. In this case, connections can be made between adjacent transistors by attaching metallic leads between appropriate electrodes. Each of the separate transistors is fully isolated from its neighbors by the high resistance of the silicon oxide layer 50 separating the transistors from one another. However, each of the lower electrodes 48 of the individual devices is connected to the lower electrodes of the other devices by means of the epitaxial layer. This makes the structure suitable for use as a common-emitter-connected integrated circuit.

If desired, an integrated circuit resistor may be formed in the wafer merely by omitting the formation of n-type region 48 and n-type zone 62, 64 or 66 from one of the isolated bodies 56, 58 or 60. Then, external leads are connected to opposite ends of the body so as to use its resistance as a resistor, and the leads are connected to other devices in the circuit.

It should be understood that many variations of the foregoing manufacturing steps may be used in accordance with the present invention. For example, it may be desired to omit the formation of n-type regions 48 until after the mesa projections have been formed, the oxide coating 50 formed, and the openings 52 made in the coating 50 as shown in FIGURE 4. In such a modification, the regions 48 could be diffused through the hole 52 by conventional diffusion techniques.

Another modification of the foregoing process would be to eliminate the formation of the mesa projections. In such a modified method, the coating 50 would be merely a flat coating instead of a cup-shaped coating as shown in FIGURES 3 through 6. If the wafer eventually were cut into separate transistors as shown in FIGURE 8, the effect of this modification merely would be to enlarge the body 28 and reduce the volume of epitaxial layer 22. However, if the wafer were not separated in individual transistors, an integrated circuit structure would be formed having a common emitter electrode and a common base electrode with multiple collector electrodes.

Figures 9, 11, 12:
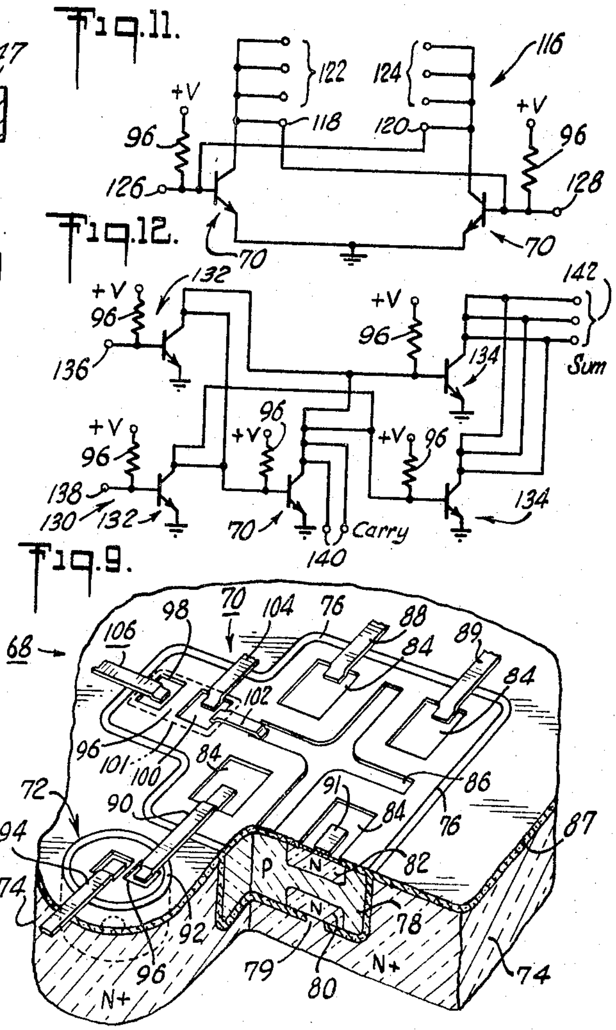
FIGURE 9 shows a typical integrated circuit constructed in accordance with the present invention.
FIGURES 10, 11 and 12 are schematic circuit diagrams of circuits utilizing the integrated circuit shown in FIGURE 9.

A typical integrated circuit structure formed in accordance with the present invention is shown in FIGURE 9. The integrated circuit device 68 shown in FIGURE 9 is broken away so that only a portion of the total device is shown. The portion shown includes a four-output-lead logic element 70 and a transistor 72 formed in a single semiconductor wafer such as the wafer 46 shown in FIGURE 1. The bottom layer 74 of the device 68 is an n+type epitaxial layer like the layer 22 shown in FIGURE 8. A dish-shaped layer 76 of silicon oxide insulation separates the epitaxial material 74 from a body 78 of p-type silicon. Four separate holes 79 (only one of which is shown in FIGURE 9) appear in the lower surface of the insulating coating 76, each hole thus providing a path for the ohmic connection of layer 74 to an n-type diffused region 80 above each hole 79. Four n-type zones 82 are diffused in the upper surface of body 78, each zone 82 being located above one of the regions 80 to form four separate transistors within the body 78. As will be discussed in greater detail below, each of the regions, zones, bodies and layers is formed by use of the method described hereinabove.

Four identical ohmic collector contacts 84 are provided, one for each separate transistor. A four-pointed cross-shaped ohmic contact 86 is formed on the surface of the body 78 to form a common base contact for all of the transistors. A silicon oxide insulating coating 87 covers the major portion of the surface of the device 68. Metallic collector leads 88, 89, 90 and 91 are bonded to the collector electrodes 84 and are connected to various portions of the circuit device 68 or to external circuitry.

The separate transistor 72 forming a part of the integrated circuit device 68 is virtually identical to the transistor 20 shown in FIGURE 8, except that the insulating layer 92 separating the epitaxial layer 74 from the device within the layer 92 ends at the upper surface of the integrated circuit device 68. That is, in the fabrication of the device 68 the lower surface of the original semiconductor wafer is lapped to a level such as to remove the lower portion of the insulating layer. Thus, the vertical portions of the insulating layers 92 and 76 extend up to the surface of the device 68, and a separate oxide coating 87 covers the major portion of the surface of the device. However, this mode of construction is optional and is chosen for illustration in FIGURE 9 only to show more clearly the outlines of the separate portions of the device 68. If desired, the lapping operation may be stopped short of removing the lowermost portions of the insulating layers. Transistor 72 has a metallic collector lead 94 and a base electrode contact 96 which is shown connected to lead 90 of the logic element 70.

An integrated resistor 96 also is formed within the cup-shaped enclosure formed by insulating layer 76 in logic element 70. Resistor 96 can comprise merely a portion of the body of semiconductor material 78 with a pair of ohmic contacts 98 and 100, or it can comprise a diffused n-type region indicated by dashed outline 101. A metallic lead 102 connects the base contact 86 of logic element 70 to the contact 100 of resistor 96. Another lead 104 is connected to contact 100, and a lead 106 is connected to contact 98, both for making external connections to the logic element 70. By this connection, an integrated resistor is connected to the base electrode region of the device 70.

If the resistivity of the body 78 is of suitable value to give a high enough resistance to the resistor 96 without the necessity of diffusion, and if it is desired to connect the resistor to the base electrode of element 70, the diffusion 101 and contact 100 can be omitted. In this case, the resistance will be merely the resistance of the semiconductor material between contact 98 and the base regions of the transistors. Thus, connection of the inegrated resistor is made internally and the external lead 102 may be omitted. On the other hand, if the ultimate in internal isolation between the device 70 and the resistor 96 is desired, the resistor 96 can be enclosed in its own separate dish-shaped insulation layer like layers 76 and 92.

The method used in constructing a device 68 is substantially that illustrated and described in connection with FIGURES 1 through 7. That is, the original wafer is formed into projections, one shaped to form the body 78 and the other shaped to form the body of transistor 72. The holes 79 in the insulation are formed as described in connection with FIGURE 4, and the diffused regions 80 also are formed by the techniques described hereinabove. Then, the epitaxial layer 74 is applied, and the lower surface of the wafer is lapped to separate each of the individual components 70 and 72. Then, the collector regions of the transistor 72 and the device 70 are diffused, the ohmic contact areas are formed and the metallic leads are applied by conventional silk screen or other well known thin-film techniques.

Figure 10:
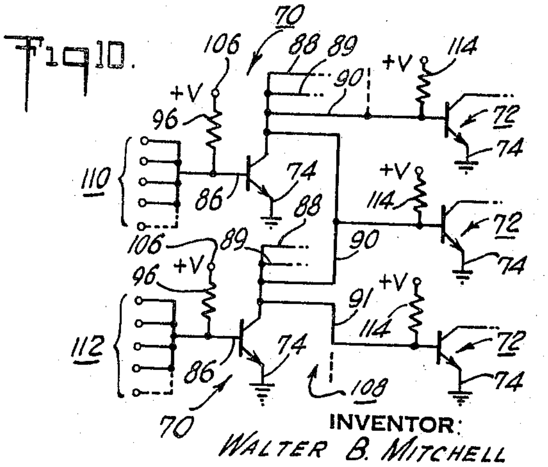

FIGURE 10 is a schematic diagram of an "AND" logic circuit 108 using the structure shown in FIGURE 9. The circuit 108 includes two logic elements 70 and three separate transistors 72 all formed preferably in the same semiconductor wafer. Actually, the circuit normally would include a greater number of both transistors and logic elements, but these are omitted for the sake of simplicity. Each logic element 70 preferably has a plurality of input leads 110 or 112 connected to its base electrode 86. Since both of the elements 70 and all of the transistors 72 are formed in the same wafer, the epitaxial layer 74 forms a common emitter connection which is connected to ground. A positive direct voltage is applied to the terminals 106 of integrated resistors 96, thus providing a positive base bias for each logic element 70.

Each of the output leads 88–91 of logic element 70 is connected to the base electrode of one of the transistors 72. A positive voltage is applied to the base electrode of each transistor 2 through a resistor 114. Often, several collector electrodes of the devices 70 are connected to the same base lead of one of the transistors 72. For example, collector electrode 90 of the upper device 70 is connected to the collector electrode 90 of the lower device 70 and both are connected to the same base electrode of a transistor 72. Such a connection provides an opportunity for "cross-talk"; that is, communication of input signals between the devices 70. However, each of the interconnected leads is isolated from the input to the other element 70 so that such cross-talk is avoided.

When either a positive signal or no signal is applied to any of input terminals 110, the positive bias on the base 86 of the upper device 70 maintains a low resistance path between each of the collector electrodes 88–91 and the emitter electrode of each device 70. This provides a low resistance path to ground for each of the base electrodes of transistors 72 to which one of the collectors of the device 70 is connected. Thus, each of the transistors 72 to which a collector electrode of the upper device 70 is connected is turned "off." However, when a signal is applied to any of the terminals 110 such that the voltage on the base lead of upper device 70 is reduced to a negative value, zero or a small positive value, this turns the upper device 70 "off" and provides a path of relatively high resistivity between each of its collector electrodes and its emitter electrode. This causes the base voltage of each transistor 72 to which device 70 is connected to rise, thus causing each such transistor to be turned "on," unless the base of that particular transistor also is connected to one of the devices 70 which is still turned "on." The central one of the transistors 72 will be turned "on" only when both of the devices 70 are turned "off." Thus, the circuit 108 showing FIGURE 10 is an "AND" circuit.

As was mentioned above, the entire circuit 108 preferably is constructed in a single wafer such as that shown in FIGURE 9. When it is so constructed it has significant advantages over the prior art. The size of the circuit is significantly reduced over prior circuits for performing the same function in that the epitaxial layer 74 forms a common ground connection for all of the transistors 72 and the logic elements 70, thus reducing considerably the amount of surface space required for interconnecting metallic leads. Furthermore, since the multiple collector electrodes of each device 70 are conductively isolated from each other by semiconductor junctions, there is no requirement for additional circuit isolating elements to prevent "cross talk." Thus, the circuit is not only reduced in size but it is also quite significantly reduced in cost. In addition, it is believed that the device shown is faster-acting than comparable devices now available. Furthermore, it is believed that the amount of power required for the circuit also is considerably less than is required in devices presently available.

The circuits shown in FIGURES 11 and 12 enjoy similar advantages due to the use of the present invention.

FIGURE 11 shows a flip-flop circuit, i.e., a bistable multivibrator circuit, composed of two logic elements 7 with one of the collector electrodes 118 or 120 of each connected to the base electrode of the other device 70. Three collector electrodes 122 or 124 are used on each element 70 as independent output terminals. Whenever a positive pulse is applied to either input terminals 126 or 128, and the element 70 whose base lead is connected to that input terminal is turned "off" (i.e., is conducting little collector-emitter current), it will be turned "on" and the other device will be turned "off." This circuit, in either of its stable states, provides voltage signals on one set of terminals 122 or 124 and no signal on the other set, thus providing the usual flip-flop function.

The circuit 116 has the further advantage that it can simultaneously feed its output signals to at least three separate circuits (depending on the number of collectors formed) and yet keep the circuits conductively isolated from one another. Thus, the present invention makes the circuit 116 simple and reduces the size and number of such circuits required in a given installation.

Circuit 116 can be formed conveniently in a single wafer of semiconductor material. Two elements 70 of the construction shown in FIGURE 9 can be formed in the wafer. The epitaxial layer 74 forms the common ground connection, and conductors similar to strip 90 can be laid upon the surface of the structure to form the base-to-collector connections.

FIGURE 12 shows a negative-logic "half-adder" circuit 130 incorporating one 4-collector logic element 70, two 2-collector logic elements 132, and two 3-collector logic elements 134. The two inputs to be added are applied to terminals 136 and 138, the "addend" to terminal 136, and the "augend" to terminal 138, for example. The base electrode of element 70 is connected to one collector of each element 132, thus forming a "NAND" circuit. Hence, an output signal is supplied over two collector leads 140 of element 70 if and only if negative signals are applied at both input terminals 136 and 138; then leads 140 supply a "carry" output signal. The other collector lead of each element 132 is connected to the base lead of one of the devices 134, and each of the collector leads of each device 134 is connected to a collector lead of the other device 134, thus forming a "NOR" circuit. That is, if a negative signal is applied to either input terminal 136 or 138, a "sum" signal will be produced on each of output terminals 142. However, this "sum" signal will not be produced if a "carry" signal is produced by the circuit because each of two other collectors of device 70 is connected to the base lead of one of devices 134.

The half-adder circuit 130 produces its sum on three separate isolated leads 142, as does the flip-flop 116 in FIGURE 11. Furthermore, the present invention reduces the size and number of components required as compared with conventional half-adder circuits.

Circuit 130 also can be formed in a single semiconductor wafer. The devices 132 and 134 are like the device 70 except that they have fewer collector electrodes. The common emitter connection is provided by the epitaxial layer 74, and interconnections can be formed on the oxide-coated upper surface.

It should be apparent that many other circuits can be constructed by use of the structure and method of the present invention. In addition, many other modifications of the structure and method can be made without departing from the scope of the invention as defined by the appended claims. The embodiments disclosed herein are meant to be merely illustrative of the broad scope of the invention.

I claim:

1. Monolithic semiconductor apparatus comprising:

(a) a body of semiconductor material of a first conductivity type having at least two surfaces;

(b) an insulative coating on one of said body surfaces having an aperture opening therethrough to said body;

(c) a region of conductivity opposite in type to and disposed in said body providing a buried junction adjacent said aperture opening;

(d) a substrate member of low resistivity conductive material of said opposite conductivity type deposited upon said insulative coating making ohmic contact through the aperture opening to said buried junction; and (e) a zone of said opposite conductivity type in said body to provide a junction adjacent the other of said two surfaces.

2. Apparatus in accordance with claim 1 in which said semiconductor body is comprised of silicon, said insulative coating is comprised of silicon oxide and said conductive substrate member comprises a highly doped epitaxial layer of silicon.

3. Apparatus in accordance with claim 1 in which said insulative coating has a plurality of aperture openings to said body, said body has a plurality of regions of opposite conductivity providing a buried junction adjacent each of said aperture openings, said conductive substrate member making ohmic contact to each buried junction through its corresponding adjacent aperture, and said body has a corresponding plurality of said opposite conductivity zones to provide a plurality of junctions adjacent the other of said two surfaces.

4. Monolithic semiconductor apparatus comprising, (a) a low resistivity conductive substrate of a first conductivity type defining a plurality of cup recesses said substrate being lined with an insulative coating having an aperture opening to the substrate at the bottom of each cup recess;

(b) a body of semiconductor material of said first conductivity type within each of said cup recesses insulated by said coating from the conductive substrate;

(c) a region of conductivity opposite in type to and disposed in each said body to provide a buried junction adjacent to and conductively connected through a corresponding aperture to the conductive substrate; and (d) a zone of said opposite conductivity type in each said body to provide a junction adjacent the upper surface of each said body.

5. Apparatus in accordance with claim 4 in which said semiconductor body is comprised of silicon, said insulative coating is comprised of silicon oxide and said conductive substrate member comprises a highly doped epitaxial layer of silicon.

References Cited

UNITED STATES PATENTS

| | | | |
|---|---|---|---|
| 3,189,973 | 6/1965 | Edwards et al. | 29—25.3 |
| 3,244,950 | 4/1966 | Ferguson | 317—235 |
| 3,290,753 | 12/1966 | Chang | 29—25.3 |
| 3,308,354 | 3/1967 | Tucker | 317—234 |
| 3,312,879 | 4/1967 | Godejahn | 317—234 |
| 3,341,379 | 9/1967 | Yasufuku et al. | 148—187 |

| | | | |
|---|---|---|---|
| 3,341,743 | 9/1967 | Ramsey | 317—101 |
| 3,357,871 | 12/1967 | Jones | 148—175 |

OTHER REFERENCES

Electronics Review, "Microelectronics — The Last Breakthrough?" 6/64, vol. 37, No. 17, p. 23.

Motorola Monitor, "The Epic Process," 6/64, vol. 2, No. 2, p. 17.

I.B.M. Tech. Disc. Bull., "Fabrication of Planar Arrays of Semiconductor Chips By Epitaxial Growth," 4/65, vol. 7, No. 11, pp. 1104.

I.B.M. Tech. Disc. Bull., "Fabrication of Two-Surface Devices," 7/66, vol. 9, No. 2, pp. 195 and 196.

JOHN W. HUCKERT, *Primary Examiner.*

R. SANDLER, *Assistant Examiner.*

U.S. Cl. X.R.

148—187; 29—569; 317—235